United States Patent [19]

Suzuki

[11] Patent Number: 4,992,983

[45] Date of Patent: Feb. 12, 1991

[54] SEMICONDUCTOR MEMORY DEVICE WITH AN IMPROVED WRITE CONTROL CIRCUIT

[75] Inventor: Toru Suzuki, Tokyo, Japan

[73] Assignee: NEC Corporation, Tokyo, Japan

[21] Appl. No.: 540,426

[22] Filed: Jun. 19, 1990.

[51] Int. Cl.[5] ............................................... G11C 8/02
[52] U.S. Cl. .............................. 365/189.05; 365/195
[58] Field of Search .................... 365/189.05, 189.01, 365/195

[56] References Cited

U.S. PATENT DOCUMENTS

| | | | |
|---|---|---|---|
| 4,669,064 | 5/1987 | Ishimoto | 365/189.05 |
| 4,858,188 | 8/1989 | Kobayashi | 365/189.05 |
| 4,922,957 | 5/1990 | Mizukami | 365/189.05 |

*Primary Examiner*—Joseph E. Clawson, Jr.
*Attorney, Agent, or Firm*—Sughrue, Mion, Zinn, Macpeak & Seas

[57] ABSTRACT

A semiconductor memory device with a write control circuit free from error which may be induced during readout operation by noise on power line, or the like, is disclosed. The memory device comprises a write circuit for writing data to a selected memory cell, and a read circuit for reading data from the selected memory cell, a first control circuit for enabling the write circuit in response to a write enable signal, and a second control circuit for enabling the read circuit in response to a read enable signal. The first control circuit additionally receives the read enable signal and enable the write circuit only when the write enable signal is present and the read enable signal is not present.

7 Claims, 2 Drawing Sheets

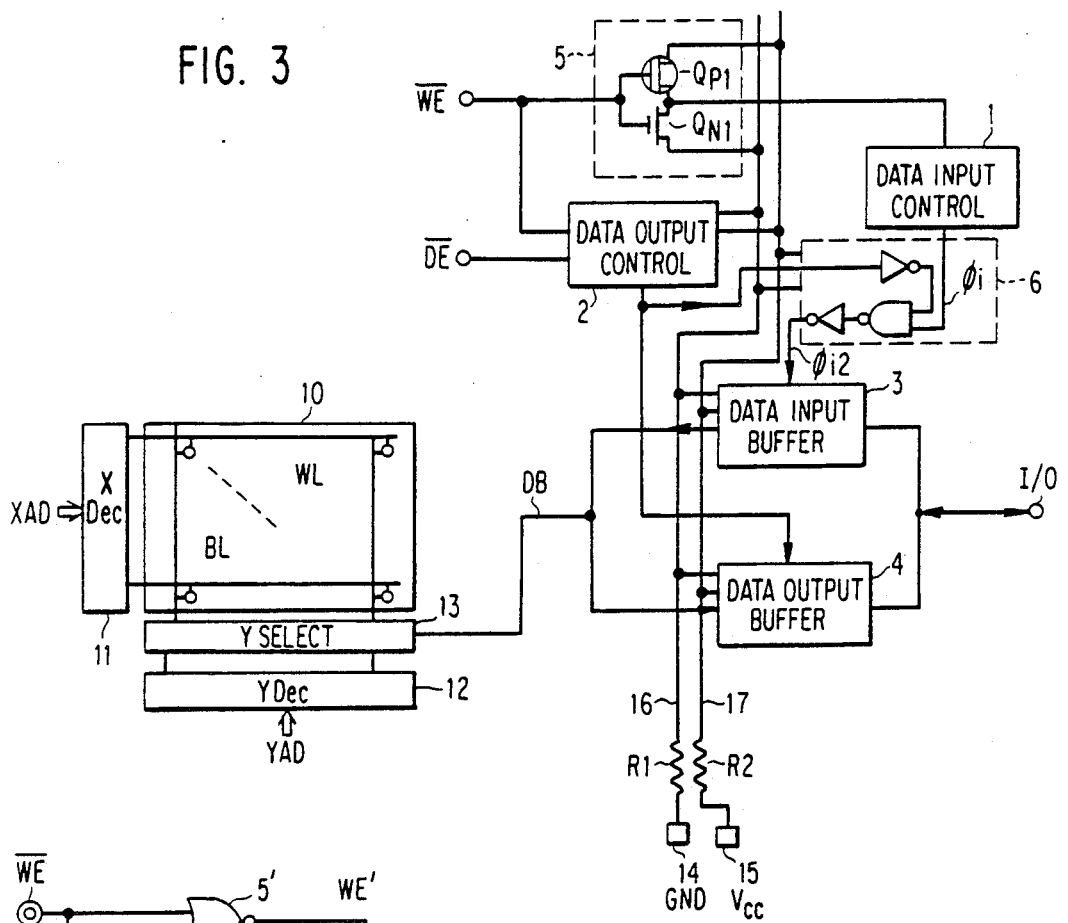
FIG. 3
FIG. 4
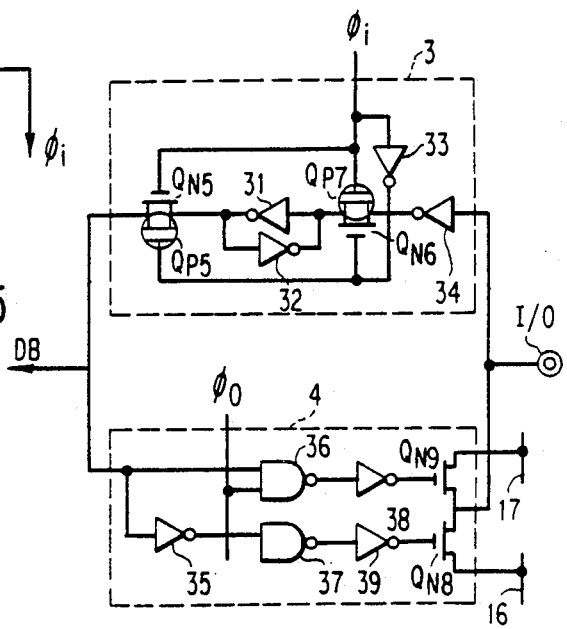
FIG. 5

SEMICONDUCTOR MEMORY DEVICE WITH AN IMPROVED WRITE CONTROL CIRCUIT

BACKGROUND OF THE INVENTION

1. Field of the Invention

This invention relates to a semiconductor memory device formed on a semiconductor substrate, and more particularly to a semiconductor memory device with an input/output terminal used both as a data input terminal and as a data output terminal.

2. Description of the Related Art

Random access memories (RAM) which allow data be read from or written into storage location thereof are widely used as large capacity data-storage devices by which the access time of the processor can be made rapid. It has been practiced in such a RAM that both of data input and output are performed through a common data input/output (I/O) terminal from the viewpoint of minimizing the number of external terminals and coordinating connections to external data bus. A data I/O terminal is connected commonly to a data input circuit and to a data output circuit. The data input circuit is activated in response to an active level of an external write enabling signal ($\overline{WE}$). As a result, a write operation is commenced by supplying a data having a logic level to a designated address in the memory cell array. On the contrary, the data output circuit is activated when a supplied read enable signal ($\overline{OE}$) is at its active level and a simultaneously supplied write enable signal ($\overline{WE}$) is at its inactive level, and thus the data is readout from a designated address of the memory cell array through the data I/O terminal.

In the above-mentioned RAM, the data input circuit is controlled merely by the state of the write enable signal ($\overline{WE}$). During write operation, the active level of write enable signal ($\overline{WE}$) disenables the data output circuit so that, even if read enable signal ($\overline{OE}$) changes to active level, readout operation is never executed. This ensures that external data level applied to the I/O terminal is prevented from getting abnormal condition which may be caused by the readout data from the RAM.

During the readout operation, however, the data input circuit is not disenabled by read enable signal ($\overline{OE}$). Both at inactive level of write enable signal ($\overline{WE}$) and at active level of read enable signal ($\overline{OE}$), the prevention of data at the input/output terminal I/O from unexpectedly being written into the RAM is attained only under the use condition that write enable signal ($\overline{WE}$) is not allowed to change to the active level until read enable signal ($\overline{OE}$) changes again to the inactive level to complete the readout operation.

Disadvantage, however, still remains in this RAM in driving external load at a high speed. When the data output circuit drives the external load coupled to the data I/O terminal, a large operating current inevitably flows therethrough. For example, when the output data at the data I/O terminal is to be changed from a "high" level to a "low" level an output transistor in an output stage of the data output circuit engages for discharging the electric charges at the data I/O terminal to ground level. A large amount of operating current causes in the data output circuit to flow through an internal power line or internal ground line in the RAM, causing a transient variation in their power potentials. On the other hand, the write enable signal having the so-called TTL level of relatively small amplitude is supplied to the input circuit, and a determination result of its logic level is produced therefrom in the so-called MOS level which is used in the RAM. Also this input circuit is connected, in the RAM, to the internal power and ground lines which are, as mentioned earlier, connected to the output circuit. Accordingly, variation in potential of the power line and the ground line resulting from the operating current of the output circuit is directly applied to the input circuit, causing an erroneous operation of the input circuit. For example, drive of the data I/O terminal from "high" level to "low" level by the output circuit causes electric current to flow to the internal ground line through the output circuit, with effect of a rise in the potential of the internal ground line. In this case, under the affection by the risen ground potential applied to the input circuit, assuming that the write enable signal is at "high" (inactive) level, the input circuit erroneously recognizes the write enable signal actually having a high level to be a "low" level, resulting, in turn, in the operation of the data input circuit during readout operation, in confliction between the data input circuit and the data output circuit, and after all in erroneous operation of the RAM.

SUMMARY OF THE INVENTION

It is a principal object of the invention to provide a semiconductor memory device free from error of the data input circuit during readout operation.

A semiconductor memory device in accordance with the present invention comprises a memory cell array including a plurality of read/write memory cells, a selection circuit for selecting at least one memory cell in the memory cell array, a write circuit for operatively writing input data applied to the input/output terminal to at least one selected memory cell when enabled, a readout circuit for operatively outputting data from the selected memory cell when enabled, a first control circuit for receiving a write enable signal and a read enable signal and enabling the read circuit only when the write enable signal is inactive in level and the read enable signal is active in level, and a second control circuit for enabling the write circuit only when the write enable signal is active in level and the first control circuit does not enable the read circuit.

According to the present invention, the second control circuit receives both the write enable signal and the output of the first control circuit in such way that during read operation with the active level of the read enable signal, the write circuit can be prevented from being operated even if the write enable signal is changed from the inactive level to the active level. Hence, in the memory device according to the invention, the write circuit remains disenabled during read operation, even if the write enable signal is erroneously recognized by the internal power line noise as the active level during the read operation. Thus erroneous operation resulting from such as confliction between read data and write data can be effectively prevented according to the invention.

BRIEF DESCRIPTION OF THE DRAWINGS

The above and further objects, features and advantages of the present invention will become more apparent from the following detailed description taken in conjunction with the accompanying drawings, wherein:

FIG. 3 is a schematic block diagram illustrating a semiconductor memory device according to a second embodiment of the present invention;

FIG. 4 is a schematic diagram illustrating examples of the data input control circuit and the data output circuit of FIG. 2; and FIG. 5 is a schematic diagram illustrating examples of the data input buffer and the data output buffer of FIG. 2:

DETAILED DESCRIPTION OF THE INVENTION

Description of Prior Art

Figure 1:
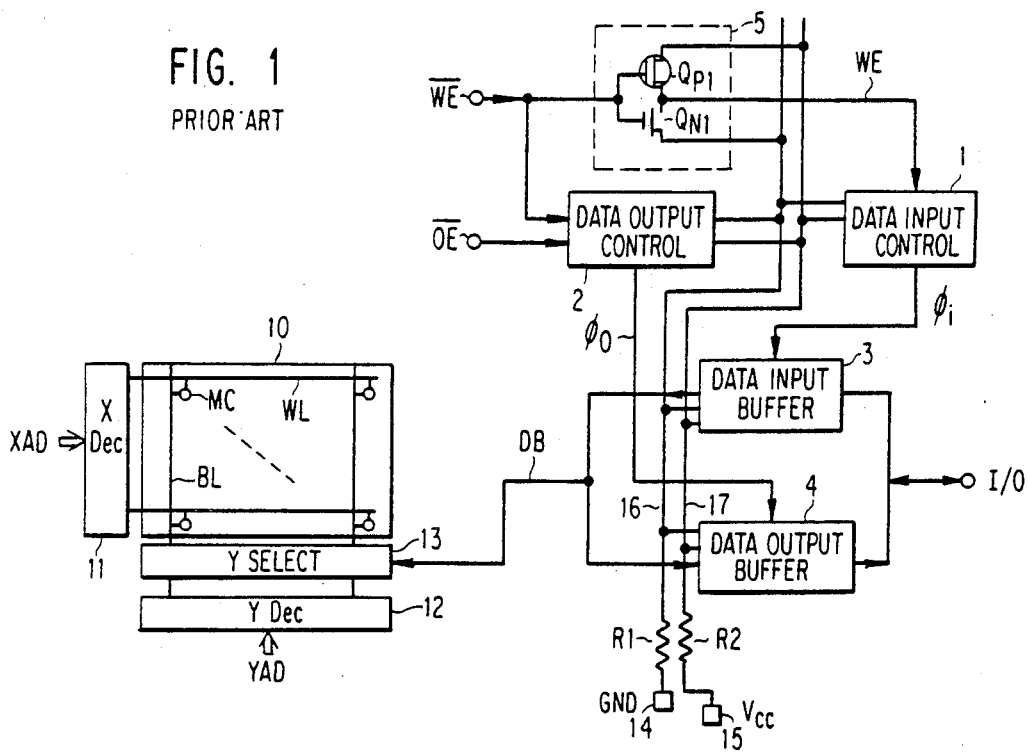
FIG. 1 is a schematic block diagram illustrating a prior art semiconductor memory device.

Referring to FIG. 1, an example of prior art semiconductor memory device which is a dynamic RAM will be described.

A memory cell array 10 comprises a matrix arrangement of a plurality of memory cells MC arranged in rows and columns. It further contains a word line WL in each row and a bit line in each column in a known way. Upon receiving a row address signal XAD, a row decoder 11 selects one of the word lines WL. Upon receiving a column address signal YAD, a column decoder 12 connects one of the bit lines BL through a column selecting circuit 13 to an internal bus line DB, which is connected to an input of a data output buffer 4 and to an output of a data input buffer 3. The input of the data input buffer 3 and the output of the data output buffer 4 are connected to the data input/output terminal I/O. A write enable signal $\overline{WE}$ of TTL level (0 to 3 V) is externally supplied to an input inverter 5, which outputs the inverted and level converted signal $\overline{WE}$ of MOS level to a data input control circuit 1. A read enable signal $\overline{OE}$ of TTL level is externally supplied to the data output control circuit 2. The data input control circuit 1 produces a control signal $\phi_i$ in response to a "high" level of the output $\overline{WE}$. The signal $\phi_i$ enables the data input buffer 3. When $\overline{WE}$ is at "high" level and $\overline{OE}$ is at "low" level, the data output control circuit 2 generates a control signal $\phi_o$ which enables an output buffer 4. A power supply pad 15 receives a power supply (Vcc). A ground pad 15 is supplied with the ground potential. From the pads 14 and 15, an internal ground line 16 and an internal power line 17 are extended, respectively, and connected to the respective circuits as shown. Thus, each circuit receives the power supply potential (Vcc) and the ground potential (GND). Reference characters R and $R_2$ designate equivalent resistance associated with the lines 16 and 17.

In this device, for executing the write operation, the write enable signal $\overline{WE}$ changes to a "low" level. Then the data input control circuit 1 is enabled, and thus controls so that external data applied to the data input/output terminal I/O is transferred through the data input buffer 3 to the memory cell array 10.

For executing readout operation, output control signal $\overline{OE}$ changes to a "low" level. Then, the data output control circuit 2 is enabled, and thus controls so that data is readout from the memory cell array 10 and transferred through the data output buffer 4 to the data input/output terminal I/O.

During the write operation, a "high" level of the write control signal $\overline{WE}$ disenables the data output control circuit 2 so that, even if the read enable signal $\overline{OE}$ changes to active (low) level, read operation never occurs. This ensures that external data level applied to the I/O terminal is prevented from becoming abnormal which may be caused by the readout data.

During read operation, however, the data input control circuit 1 is not disenabled. Both at inactive level of write enable signal $\overline{WE}$ and at active level of readout enable signal $\overline{OE}$, therefore, the prevention of data at the I/O terminal from unexpectedly being written during readout operation is attained only under the use condition that write enable signal $\overline{WE}$ is not allowed to change to a "low" level until readout enable signal $\overline{OE}$ changes again to a "high" level to finish the readout operation.

In this memory device, in view of meeting the requirement for high speed data output to the external load connected to the data input/output terminal (I/O), the data output buffer 4 comprises a large-current output transistors (not shown) for accomplishing high speed readout operation. The readout operation, therefore, is inevitably accompanied by large current through the output transistor, probably resulting in occurrence of noise on the internal power line 17 or the ground line 16.

When the write enable signal $\overline{WE}$ is at "high" level, the propagation of this noise to the data input control circuit 1 and the inverter 8 along the ground line 16 results in reduction in potential difference between the gate and source of an n-channel MOS transistor $Q_{N1}$ of the inverter 5, and in turn decrease in current capacity of transistor $Q_{n1}$. If this decreased current capacity is inferior to the current capacity of transistor $Q_{p1}$, the output $\overline{WE}$ of the inverter 5 erroneously changes to "high" level, though it is to be "low" level originally, this bringing about error of the data input control circuit 1.

Particularly, the high level of $\overline{WE}$ of TTL level is extremely low as compared with the "high" level of the internal signal having MOS level, and hence noise on the internal ground line 16 tends to induce error.

DESCRIPTION OF THE EMBODIMENTS

A semiconductor memory device according to a first embodiment of the present invention will be explained with reference to FIG. 2.

In the following description, corresponding components or parts in FIG. 2 to those in FIG. 1 are designated by same or similar reference characters as used in FIG. 1, and thus detailed description of them are omitted.

This embodiment can be obtained by employing in place of the input inverter 5 shown in FIG. 1, a NOR circuit 5' receiving $\overline{WE}$ and $\phi_o$.

The NOR circuit 5' which is composed of p-channel transistors $Q_{p3}$, $Q_{p4}$ and n-channel transistors $Q_{n3}$, $Q_{n4}$. It outputs an internal signal WE' which becomes active ("high") level when the write enable signal $\overline{WE}$ is at active ("low") level and the signal $\phi_o$ is at inactive ("low") level, and becomes inactive ("low") level when the signal $\phi_o$ is at active ("high") level. The data input control circuit 1 receives the output signal WE' of the NOR circuit 5' and outputs a data input control signal $\phi_i$ to the data input buffer 3. When the output signal WE' from the NOR circuit 5' is at active level, a data input control signal $\phi_i$ of active ("high") level is output to operate the data input buffer 3. When the output signal WE' of the NOR circuit 5' is at inactive ("low")

level, another data input control signal $\phi_i$ of inactive ("low") level deactivates the data input buffer 3.

The data output control circuit 2 receives the output enable signal $\overline{OE}$ and outputs a data input control signal $\phi_o$ to the data output buffer 4. When the output enable signal $\overline{OE}$ is at an active ("low") level, a data output control signal $\phi_o$ of an active ("high") level enables the data output buffer 4. When the write enable signal $\overline{WE}$ is at an active ("low") level, the data output control signal $\phi_o$ of an inactive ("low") level deactivates the data output buffer 4.

In this embodiment, the NOR circuit 5, the data input control circuit 1, and the data output control circuit 2 constitutes not only a write control means which, when the write enable signal $\overline{WE}$ is at an active level, enables the data input buffer 3 and deactivates the data output buffer 4 but also a read-out control means which, when the signal $\phi_o$ is at an active level, enables the data output buffer 4 and deactivates the data input buffer 3.

In FIG. 4, is shown example of the construction involving data input control circuit 1, the NOR circuit 5', and the data output control circuit 2'. The data output control circuit 2 is composed of an inverter 22 receiving $\overline{WE}$ and a NOR circuit 21 receiving the output of the inverter 22 and $\overline{OE}$ and outputting signal $\phi_o$. The data input control circuit 1, which is composed of inverters 23, 24 connected in cascade, delays signal WE' and outputs the signal $\phi_i$.

Figure 2:
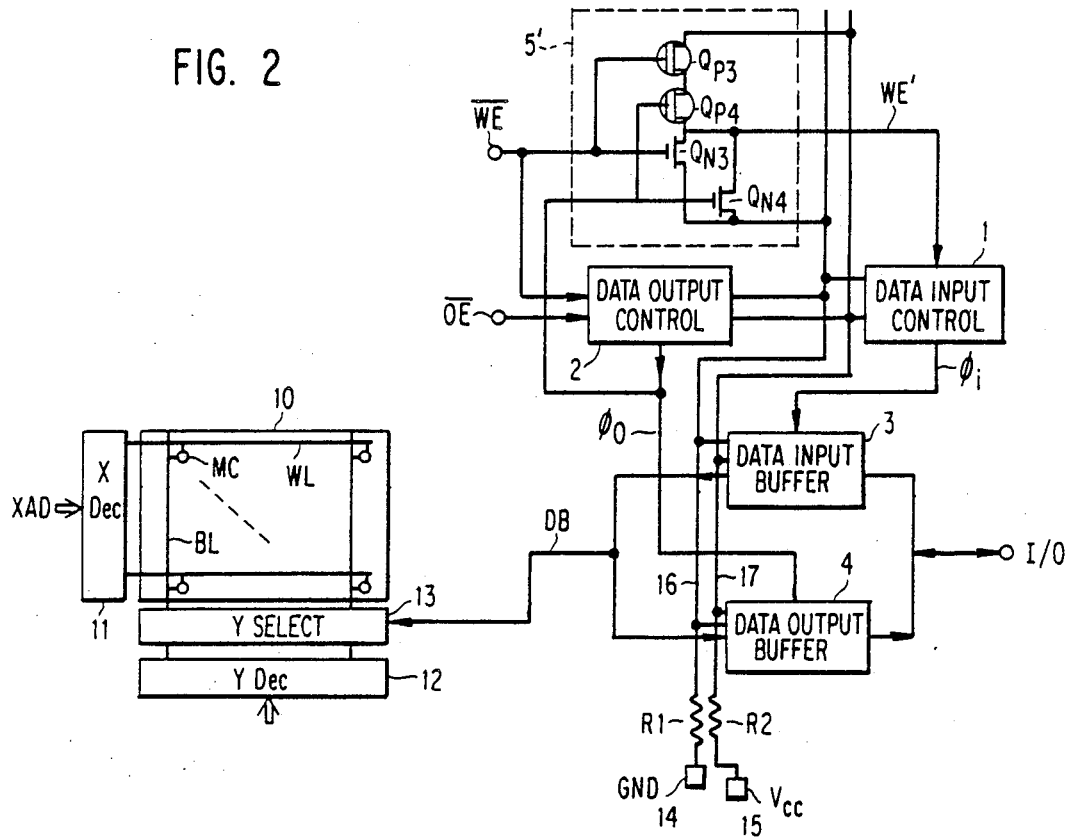
FIG. 2 is a schematic block diagram illustrating a semiconductor memory device according to a first embodiment of the present invention.

FIG. 5 shows example of the data input buffer 3 and data output buffer 4 employed in FIG. 2.

The data output buffer 4 is composed of an output inverter consisting of an n-channel transistor $Q_{n9}$ and an n-channel transistor $Q_{n8}$, and a control section consisting of inverters 35, 38, 39 and NAND circuits 36, 37. In the control section, when the signal $\phi_o$ is at "low" level, the gates of transistors $Q_{n8}$, $Q_{n9}$ become "low" level, resulting in the change of the state of the output inverter into high impedance, and when the signal $\phi_o$ is at "high" level, one of the transistors $Q_{n8}$, $Q_{n9}$ turns ON and the rest turns OFF in accordance with the level of the bus DB. The source of the transistor $Q_{n8}$ of the output inverter is connected to the internal ground line 16 and the drain of transistor $Q_{n9}$ is connected to the internal power line 17.

The data input buffer 3 comprises inverters 31 and 32 forming a flip-flop; an inverter 34; a p-channel transistor $Q_{p7}$ and an n-channel transistor $Q_{n6}$ forming CMOS transfer gate for data write; a p-channel transistor $Q_{p5}$ and an n-channel transistor $Q_{n5}$ forming a data read-out CMOS transfer gate; and an inverter 33 outputting inverted signal of signal $\phi_i$. The data input buffer 3, when signal $\phi_i$ is at "low" level, latches data at the terminal I/O by the flip-flop (31, 32), and when the signal $\phi_i$ changes to high level, transfers the latched data through the transfer gate $Q_{n5}$, $Q_{p5}$ to the data bus DB. Thus write operation into the selected memory cell is accomplished.

In the following, the operation of this embodiment will be described:

The data input control circuit 1 generates the data input control signal $\phi_i$ in accordance with the input states of the write enable signal $\overline{WE}$ and the read enable signal $\overline{OE}$. Under control of the data input buffer 3 by the data input control signal $\phi_i$, external data applied to the input/output terminal I/O is transferred to the memory cell array 10.

The data output control circuit 2 generates the data output control signal $\phi_o$ in accordance with the input states of the write enable signal $\overline{WE}$ and the read enable signal $\overline{OE}$. Under control of the data output buffer 4 by the data output control signal $\phi_o$, data read from the memory cell array 10 is transferred to the input/output terminal I/O.

Upon starting of readout operation in response to "high" level of the write enable signal $\overline{WE}$ and at "low" level of output enable signal $\overline{OE}$, the data output control signal $\phi$hd o changes to "high" (active) level.

In this case, from the aspects that "high" level of the data output control signal $\phi$hd o is the power supply level (vcc), the p-channel transistor $Q_{p4}$ of the NOR circuit 5' is rendered non-conductive, and the n-channel transistor $Q_{n4}$ is held conductive, thus even if noise appearing on the internal ground line 16 caused by the readout operation is transmitted to the sources of transistors $Q_{n3}$ and $Q_{n4}$, connected to the ground line 16 in the NOR circuit 5' to which the write enable signal $\overline{WE}$ and the data output control signal $\phi$hd o are applied, then the output WE' is set at "low" level. Thus the data input control circuit 1 is operated without error.

In this case, the "low" level of the output WE' becomes higher somewhat than the specified ground level depending on potential of the ground line 16. However, the internally-generated output WE' assumes the MOS level of an amplitude of 0 to 5 V, and thus the output WE' still remains at "low" level of MOS level for the circuit receiving it, which never brings problem.

With reference to FIG. 3, a second embodiment of the present invention will be explained.

This embodiment is so constructed that a logic circuit 6 makes logic operation of the output signal $\phi_i$ from the data input control circuit 1 and the data output control signal $\phi$hd o and outputs a data input control signal $\phi_{i2}$ for controlling the operation of data input buffer 3.

Upon starting of readout operation in response to "high" level of the write enable signal $\overline{WE}$ and to "low" level of the read enable signal $\overline{OE}$, the data output control signal $\phi$hd o changes to "high" (active) level. Regardless of the level of the output signal $\phi_i$ of the data input control circuit 1, the data input control signal $\phi_{i2}$ becomes "low" level, and the data input buffer 3 is deactivated. In virtue of this, even if noise on the internal ground line 16 caused by readout operation, induces error in the data input control circuit 1, the data input buffer 3 remains errorless.

As described above, advantage of the present invention resides in being free from error which may be induced by noise appearing on the ground line during readout operation in virtue of the construction that data readout enable signal deactivates write operation.

What is claimed is:

1. A semiconductor memory device comprising a memory cell array including a plurality of read/write memory cells, selection means for selecting at least one memory cell in said memory cell array, a first input means for receiving a write enable signal, a second input means for receiving a read enable signal, a data input/output terminal, a write circuit for operatively writing data applied to said input/output terminal to the selected memory cell when enabled, a read circuit for operatively outputting data from the selected memory cell to said input/output terminal when enabled, a first control circuit coupled to said first and second input means, said first control circuit enabling said read circuit only when said read enable signal is active in level, and a second control circuit coupled to said first input means and said first control circuit, said second control circuit enabling said write circuit only when said write enable signal is active in level and said first control circuit disenables said read circuit.

2. A semiconductor memory device as claimed in claim 1, wherein said second control circuit includes a NOR circuit having first and second input terminals, said first input terminal being connected to said first input means and said second input terminal being connected to said first control circuit.

3. A semiconductor memory device as claimed in claim 1, wherein said first control circuit includes a first inverter having an input terminal connected to said second input means, and a NOR circuit having first and second input ends, said first input end being connected to the output of said first inverter and said second input end being connected to said second input means.

4. A semiconductor memory device as claimed in claim 1, further comprising an internal power line and an internal ground line connected to said read circuit, said write circuit, and said first and second control circuits.

5. A semiconductor memory device as claimed in claim 1, wherein said write circuit includes a flip-flop, means for setting a state of said flip-flop in response to data applied to said input/output terminal, and means for setting a state of the selected memory cell in response to the state of said flip-flop.

6. A semiconductor memory device as claimed in claim 1, wherein said memory cell array includes a plurality of word lines arranged in rows and a plurality of bit lines arranged in columns, and said selection means includes a row decoder for selecting one of said word lines, and a column decoder for selecting at least one of said bit lines.

7. A semiconductor memory device comprising a memory cell array having a plurality of memory cells, selection means for selecting at least one memory cell of said memory cell array, an input/output terminal, a write circuit for operatively, writing data applied to said input/output terminal to the selected memory cell when enabled, a read circuit for operatively, outputting data from the selected memory cell to said input/output terminal when enabled, a first control circuit receiving a write enable signal and a read enable signal and enabling said read circuit only when said write enable signal is inactive level and said read enable signal is active in level, and a second control circuit for enabling said data write circuit only when said write enable signal is active in level and said read circuit is not enabled.

* * * * *

UNITED STATES PATENT AND TRADEMARK OFFICE
CERTIFICATE OF CORRECTION

PATENT NO. : 4,992,983

DATED : February 12, 1991

INVENTOR(S) : Toru SUZUKI

It is certified that error appears in the above-identified patent and that said Letters Patent is hereby corrected as shown below:

Col. 3, line 35, delete "$\overline{WE}$" and insert --$\overline{WE}$--

Col. 4, line 33, delete "$\overline{WE}$" and insert --$\overline{WE}$--

Col. 6, line 9, delete "$\phi$hd o" and insert --$\phi_o$--

Col. 6, line 11, delete "$\phi$hd o" and insert --$\phi_o$--

Col. 6, line 19, delete "$\phi$hd o" and insert --$\phi_o$--

Col. 6, line 34, delete "$\phi$hd o" and insert --$\phi_o$--

Col. 6, line 39, delete "$\phi$hd o" and insert --$\phi_o$--

Signed and Sealed this

First Day of September, 1992

*Attest:*

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO. : 4,992,983
DATED : February 12, 1991
INVENTOR(S) : Toru Suzuki It is certified that error appears in the above-identified patent and that said Letters Patent is hereby corrected as shown below:

Title page, item [30], insert, FOREIGN APPLICATION PRIORITY

--June 19, 1989 [JP] Japan.....................157674/1989--.

Signed and Sealed this

Thirteenth Day of April, 1993

*Attest:*

STEPHEN G. KUNIN

*Attesting Officer*     *Acting Commissioner of Patents and Trademarks*